(12) United States Patent
Aoyama et al.

(10) Patent No.: US 9,887,175 B2
(45) Date of Patent: Feb. 6, 2018

(54) LIGHTING DEVICE

(75) Inventors: Tomoya Aoyama, Kanagawa (JP); Satoshi Seo, Kanagawa (JP)

(73) Assignee: Semiconductor Energy Laboratory Co., Ltd. (JP)

(*) Notice: Subject to any disclaimer, the term of this patent is extended or adjusted under 35 U.S.C. 154(b) by 87 days.

(21) Appl. No.: 13/337,732

(22) Filed: Dec. 27, 2011

(65) Prior Publication Data

US 2012/0161116 A1    Jun. 28, 2012

(30) Foreign Application Priority Data

Dec. 28, 2010    (JP) .................................. 2010-293039

(51) Int. Cl.
*H01L 25/04* (2014.01)
*F21L 4/02* (2006.01)
(Continued)

(52) U.S. Cl.
CPC .............. *H01L 25/048* (2013.01); *F21L 4/027* (2013.01); *F21S 6/002* (2013.01); *F21S 8/033* (2013.01); *F21S 8/04* (2013.01); *F21W 2131/103* (2013.01); *F21Y 2105/00* (2013.01); *F21Y 2113/20* (2016.08); *F21Y 2115/10* (2016.08); *F21Y 2115/15* (2016.08); *F21Y 2115/20* (2016.08); *H01L 2924/0002* (2013.01)

(58) Field of Classification Search
CPC ........... H01L 25/048; H01L 2924/0002; F21Y 2105/00; F21Y 2101/00; F21Y 2115/20; F21Y 2113/20; F21S 6/002; F21S 8/04; F21S 8/033; F21W 2131/103; F21L 4/027

USPC .......... 257/40, 99, 13, 88–92, 103, E27.119; 362/487, 48
See application file for complete search history.

(56) References Cited

U.S. PATENT DOCUMENTS 8,264,142 B2    9/2012  Amelung et al.
2005/0083287 A1    4/2005  Yamazaki et al.
(Continued)

FOREIGN PATENT DOCUMENTS

GB    WO 2013064800 A1 *   5/2013    ......... H01L 27/3225
JP    7-199824 JP    8/1995
(Continued)

OTHER PUBLICATIONS

Machine translation of JP 2010198980, translated Jul. 31, 2014.*
Machine translation of JP 2009252572, translated Mar. 28, 2016.*

*Primary Examiner* — Lauren R Bell
(74) *Attorney, Agent, or Firm* — Husch Blackwell LLP (57) ABSTRACT

A lighting device includes a plurality of organic EL light-emitting devices having organic EL elements, and a plurality of LEDs. The LEDs are provided as point light sources, and the organic EL light-emitting devices are provided as surface light sources. Using an LED which emits blue light and an organic EL element which emits yellow light, white light can be obtained. The LEDs are provided on the back side or the front side of the organic EL light-emitting devices so that light from the LEDs pass between the two organic EL light-emitting devices. Accordingly, light can be extracted from the LEDs without allowing the LED light to pass through the organic EL elements. Further, the organic EL element is sealed by two substrates and a sealant, whereby deterioration due to moisture or oxygen can be prevented.

8 Claims, 6 Drawing Sheets

(51) Int. Cl.
    *F21S 6/00*                (2006.01)
    *F21S 8/00*                (2006.01)
    *F21S 8/04*                (2006.01)
    *F21W 131/103*        (2006.01)
    *F21Y 105/00*          (2016.01)
    *F21Y 115/20*          (2016.01)
    *F21Y 113/20*          (2016.01)
    *F21Y 115/10*          (2016.01)
    *F21Y 115/15*          (2016.01)

(56) References Cited

U.S. PATENT DOCUMENTS

| | | |
|---|---|---|
| 2005/0169012 A1 | 8/2005 | Takeuchi et al. |
| 2005/0207156 A1* | 9/2005 | Wang ............... F21K 9/00 362/240 |
| 2005/0248935 A1 | 11/2005 | Strip et al. |
| 2006/0027781 A1 | 2/2006 | Dong et al. |
| 2007/0146242 A1* | 6/2007 | Miller et al. ............ 345/76 |
| 2007/0205423 A1* | 9/2007 | Yamazaki et al. ............ 257/89 |
| 2008/0094004 A1* | 4/2008 | Ackermann ............... 315/294 |
| 2008/0261075 A1 | 10/2008 | Seo et al. |
| 2009/0262545 A1* | 10/2009 | Amelung et al. ............ 362/487 |
| 2010/0157585 A1* | 6/2010 | Diekmann et al. ........... 362/228 |
| 2012/0113632 A1 | 5/2012 | Aoyama et al. |

FOREIGN PATENT DOCUMENTS

| | | | |
|---|---|---|---|
| JP | 9-148628 | | 6/1997 |
| JP | 11-8067 | | 1/1999 |
| JP | 2001-143865 | | 5/2001 |
| JP | 2002-100229 | | 4/2002 |
| JP | 2002-133915 | A | 5/2002 |
| JP | 2007-5228 | | 1/2007 |
| JP | 2008-512837 | | 4/2008 |
| JP | 2009-252572 | A | 10/2009 |
| JP | 2009252572 | A * | 10/2009 |
| JP | 2009-266818 | A | 11/2009 |
| JP | 2010198980 | A * | 9/2010 |

* cited by examiner

LIGHTING DEVICE

BACKGROUND OF THE INVENTION

1. Field of the Invention

In this specification, description is made on a lighting device in which a light-emitting diode (LED) and an organic electroluminescence element (organic EL element) are used as light sources.

2. Description of the Related Art

A lighting device referred to as LED lighting is lighting equipment in which a light-emitting diode (LED) that is a kind of a semiconductor element is used as a light source. The LED lighting saves power and has a long life; thus, it has been attracting attention as an alternative to a fluorescent lamp.

Further, an organic electroluminescence element (an organic EL element) is known as a light-emitting element using an organic material. The organic EL element is also a kind of a light-emitting diode, and is also referred to as an OLED or an organic LED in some cases. A typical example of a device using an organic EL element is an organic EL display device in which an organic EL element is used in a pixel. Digital cameras and cellular phones in which organic EL display devices are used in their display portions have been commercialized.

Further, obtaining white light by combining an LED and an organic EL element which emit lights with different wavelengths, has been proposed. For example, Patent Document 1 discloses a lighting device in which an inorganic LED and an organic EL element are combined. Patent Documents 2 to 5 each disclose a display device in which an inorganic LED and an organic EL element are combined.

REFERENCE

Patent Documents

[Patent Document 1] Japanese Translation of PCT International Application No. 2008-512837
[Patent Document 2] Japanese Published Patent Application No.H07-199824
[Patent Document 3] Japanese Published Patent Application No.H09-148628
[Patent Document 4] Japanese Published Patent Application No.H11-008067
[Patent Document 5] Japanese Published Patent Application No. 2001-143865

SUMMARY OF THE INVENTION

In this specification, an object is to extend the life of a lighting device including an organic EL element and an LED. Further, an object is to reduce loss of light emitted from the LED in the lighting device so that luminous efficiency and luminance of the lighting device are improved. The present invention aims to achieve at least one of the objects.

An embodiment of the present invention is a lighting device including a plurality of light-emitting devices having organic EL elements and a plurality of light-emitting diodes. In the lighting device, the light-emitting devices each include a first substrate, a second substrate, a sealant, and the organic EL element; the organic EL element is sealed by the first substrate, the second substrate, and the sealant; and the plurality of light-emitting diodes are provided on the back side or the front side of the plurality of light-emitting devices so as not to overlap with the plurality of light-emitting devices.

In the lighting device according to the embodiment, the light-emitting diode has a peak of the emission wavelength of greater than or equal to 400 nm and less than or equal to 500 nm, and an emission color of the organic EL element can be a complementary color of an emission color of the light-emitting diode.

According to the invention disclosed in this specification, the useful life of a lighting device including organic EL elements and light-emitting diodes (LEDs) can be extended. Further, loss of light emitted from the LEDs can be reduced, so that luminous efficiency and luminance of the lighting device can be improved.

DETAILED DESCRIPTION OF THE INVENTION

Embodiments of the invention disclosed in this specification will be described with reference to the accompanying drawings. However, the invention is not limited to the description below, and those skilled in the art will appreciate that a variety of modifications can be made to the modes and details without departing from the spirit and scope of the invention. Therefore, the invention which is disclosed should not be interpreted as being limited to the following description of the embodiments.

(Embodiment 1)

Embodiment 1 is described with reference to FIG. 1, FIG. 2, FIG. 3, FIG. 4, FIG. 5, FIG. 6, and FIGS. 7A to 7C.

Figure 1:
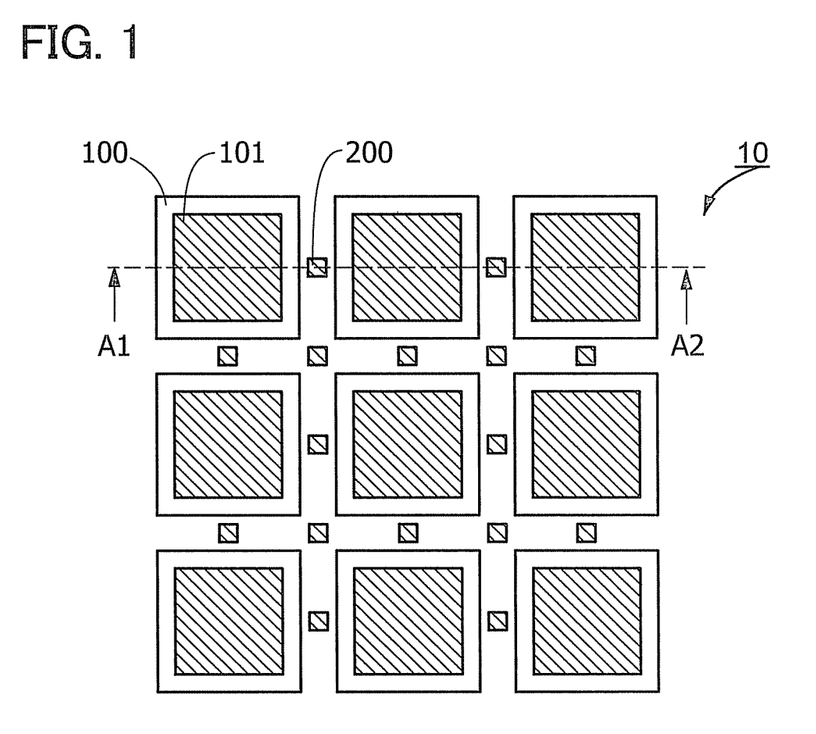
FIG. 1 is a general plan view illustrating an embodiment of a lighting device.
Figure 2:
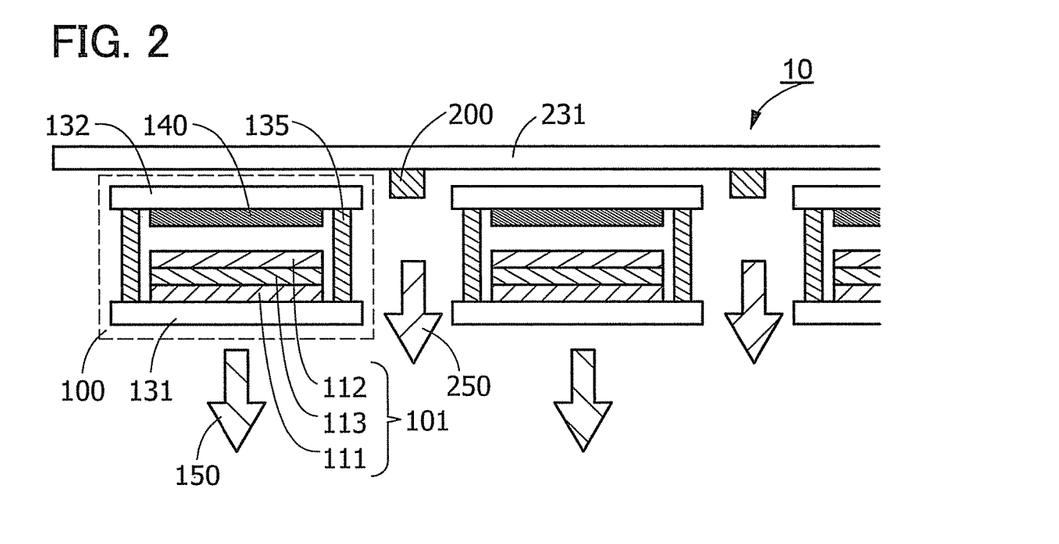
FIG. 2 is a cross-sectional view taken along line A1-A2 of FIG. 1.

FIG. 1 is a plan view illustrating a structural example of a lighting device of this embodiment. FIG. 2 is a schematic cross-sectional view of the lighting device along line A1-A2 of FIG. 1. As illustrated in FIG. 1, a lighting device 10 includes a plurality of organic EL light-emitting devices 100 having organic EL elements 101 and a plurality of LEDs 200 as light sources. In the lighting device 10, a mixture of light from the organic EL light-emitting devices 100 and light from the LEDs 200 is used as illumination light. Thus, setting the color of light (the wavelength of light) of the organic EL light-emitting device 100 and the color of light of the LED 200 at appropriate, the lighting device 10 can emit lights of various colors such as white light Since an emission region of the LED 200 is formed on a semiconductor chip, the LED 200 functions as a point light source in the lighting device 10. On the other hand, an emission region of the organic EL element 101 can have a large area to the extent that the emission region can be considered as a plane with respect to the LED 200, and the organic light-emitting device 100 function as a surface light source in the lighting device 10.

However, the size of the emission region of the organic EL element 101 is limited due to the problems of a voltage drop of an electrode of the organic EL element 101 and a decrease in yield. Thus, as illustrated in FIG. 1, by providing the plurality of organic EL light-emitting devices 100 in the lighting device 10, an illumination area of the lighting device 10 is expanded. The organic EL light-emitting devices 100 are provided in a plane (or on a curved surface) as if tiles are spread all over. In order to utilize the light from the organic EL light-emitting devices 100 and the light from the LEDs 200 as illumination light, the LEDs 200 are provided so as to be adjacent to the organic EL light-emitting devices 100 and so as not to overlap with the organic EL light-emitting devices 100 in an emission direction of the illumination light. FIG. 1 shows an example of a plan layout of the lighting device 10 (organic EL light-emitting devices 100 and LEDs 200). In FIG. 1, nine organic EL light-emitting devices 100 each having a quadrangular plan shape are arranged in three rows and three columns at intervals.

Note that the plan shape (the emission region) of the light-emitting region (a light-emitting layer 113 in FIG. 2 described below) of the organic EL element 101 is a quadrangle in FIG. 1; however, the plan shape is not limited to a quadrangle, and can be any given shape. For example, the plan shape of the light-emitting layer 113 may be a polygonal shape such as a quadrangle, a triangle, or a hexagon, a circular, or an ellipse.

FIG. 2 is a cross-sectional view taken along line A1-A2 of FIG. 1, illustrating an example of a cross-sectional structure of the lighting device 10.

As illustrated in FIG. 2, the organic EL light-emitting device 100 includes the organic EL element 101, a substrate 131, a substrate 132, a sealant 135, and a drying agent 140. The organic EL element 101 is formed over the substrate 131, and includes an electrode 111, an electrode 112, and the light-emitting layer 113. The organic EL element 101 includes the light-emitting layer 113 containing at least a light-emitting organic compound between the electrode 111 and the electrode 112. In addition to the light-emitting layer 113, for example, a layer selected from a hole-injection layer, a hole-transport layer, an electron-transport layer, and an electron-injection layer can be provided for the organic EL element 101.

One of the electrodes 111 and 112 of the organic EL element 101 is an anode, and the other is a cathode. Further, light 150 (hereinafter, referred to as OLED light 150) emitted from the light-emitting layer 113 is extracted from the organic EL light-emitting device 100; thus, at least one of the electrodes 111 and 112 is a light-transmitting electrode which transmits the OLED light 150.

The substrate 132 is a substrate for sealing the organic EL element 101 and is fixed to the substrate 131 with the sealant 135 so as to be opposite to the substrate 131. The organic EL element 101 is installed in space sealed by the substrates 131, 132, and the sealant 135. The drying agent 140 is fixed to the substrate 132, and is sealed by the substrates 131, 132, and the sealant 135 together with the organic EL element 101. The organic EL element 101 is sealed in this manner; thus, deterioration of the organic EL element 101 due to moisture and oxygen can be suppressed.

A material which hardly transmits moisture and oxygen is selected for the sealant 135 so as to form enclosed space. For example, an epoxy-based resin is preferable for the sealant 135. Further, the space sealed by the substrates 131 and 132, and the sealant 135 is filled with a dried inert gas (e.g., a nitrogen gas, an argon gas, or the like), or a filler made of a resin. Note that in the case of using the filler, the drying agent 140 is not necessarily provided.

For the drying agent 140, a substance which absorbs moisture by chemical adsorption such as alkaline earth metal oxide (e.g., calcium oxide or barium oxide), or a substance which adsorbs moisture by physical adsorption such as zeolite or silica gel can be used. By providing the drying agent 140, deterioration of the organic EL element 101 due to moisture can be suppressed. As a result, the life of the lighting device 10 can be extended. The drying agent 140 is provided so as not to block the OLED light 150. In a structure in which the OLED light 150 passes through the substrate 131 as shown in FIG. 2, the drying agent 140 is provided for the substrate 132; thus, position alignment of the drying agent 140 is not necessary and the drying agent 140 can be provided so as to be opposite to the organic EL element 101.

The LED 200 is mounted on a substrate 231 so that light 250 (hereinafter, referred to as LED light 250) emitted from the LED 200 passes between the two organic EL light-emitting devices 100. By extracting the LED light 250 without allowing the LED light 250 to pass through the organic EL element 101, loss of the LED light 250 can be suppressed. Thus, luminous efficiency and luminance of the lighting device 10 can be improved. Note that luminous efficiency of the lighting device 10 means a light output per unit electric power (lm/W).

Further, the LED 200 can be provided apart from the organic EL element 101; thus, deterioration of the organic EL element 101 due to heat generation of the LED 200 can be suppressed. As illustrated in FIG. 2, in the case where the substrate 231 on which the LED 200 is mounted is provided on the substrate 132 side (the back side of the organic EL light-emitting device 100), a cooling wheel for suppressing the increase in temperature of the LED 200 is easily provided. Note that the substrate 132 side in FIG. 2 is the back side of the organic EL light-emitting device 100 and is the side opposite to the side from which the OLED light 150 is extracted.

Figure 3:
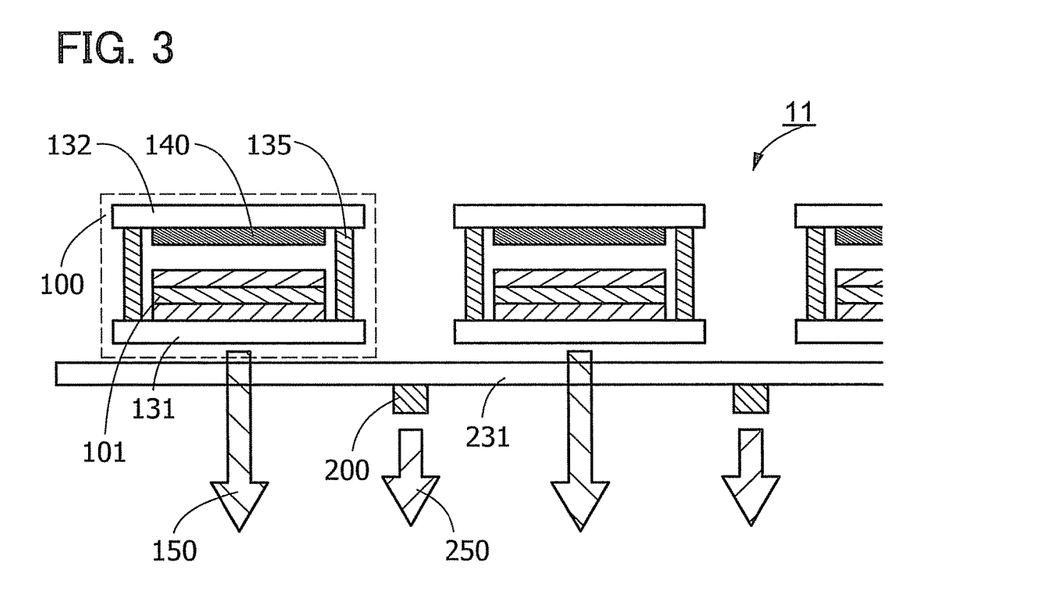
FIG. 3 is a cross-sectional view illustrating an embodiment of a lighting device.

The substrate 231 can be provided on the front side of the organic EL light-emitting device 100 (the side from which OLED light 150 is extracted). An example of a lighting device having such a structure is shown in FIG. 3. FIG. 3 is a cross-sectional view illustrating a structural example of a lighting device 11. A plan layout of the lighting device 11 is the same as the plan layout of the lighting device 10. The OLED light 150 passes through the substrate 231 in the lighting device 11. Thus, loss of the OLED light 150 in the lighting device 10 is smaller than that in the lighting device 11.

The lighting device can have a structure in which the OLED light 150 passes through the substrate 132 and is extracted as illumination light. Lighting devices having such a structure are shown in FIG. 4 and FIG. 5.

Figure 4:
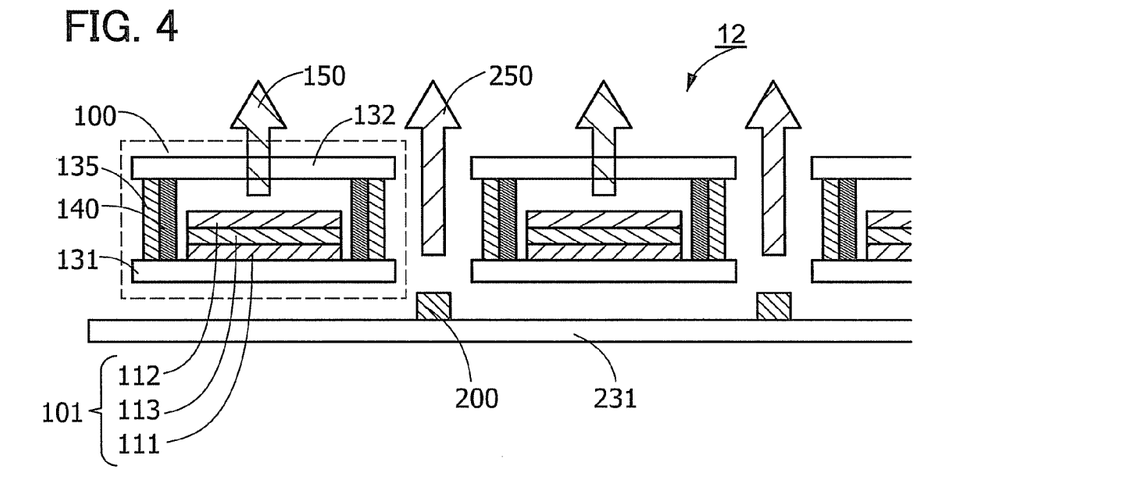
FIG. 4 is a cross-sectional view illustrating an embodiment of a lighting device.

FIG. 4 is a cross-sectional view illustrating another structural example of the lighting device. As illustrated in FIG. 4, in a lighting device 12, the OLED light 150 passes through the substrate 132. Thus, in the organic EL element 101 in FIG. 4, the electrode 112 is a light-transmitting electrode and is provided as an anode; on the other hand, the electrode 111 is a reflective electrode and is provided as a cathode. Further, the drying agent 140 is provided between the side face of the organic EL element 101 and the sealant 135 so as not to block the OLED 150. Further, in the case where the enclosed space by the substrates 131 and 132, and the sealant 135 is filled with a filler (a solid) instead of an inert gas, the drying agent 140 is not necessarily provided. Further, also in each of the lighting devices 10 and 11, the drying agent 140 can be provided as the one illustrated in FIG. 4.

Figure 5:
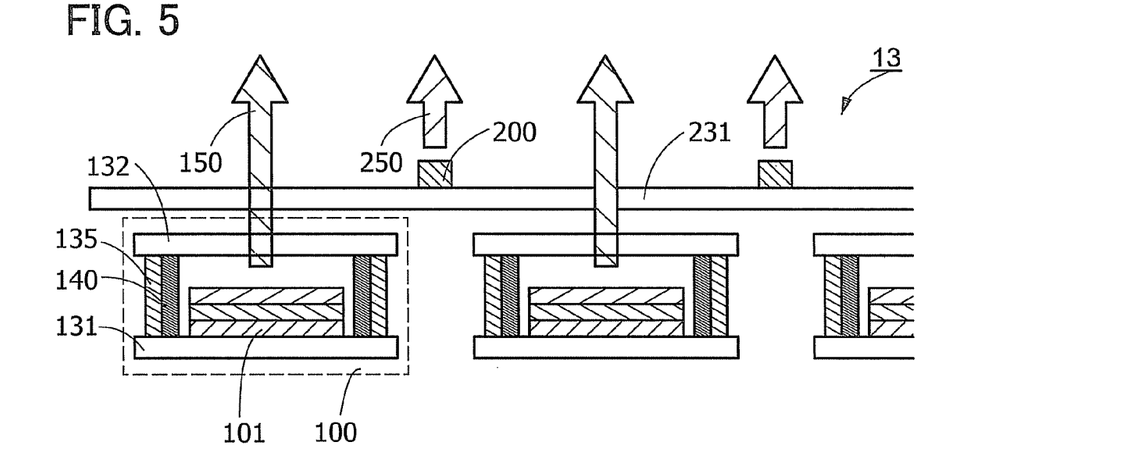
FIG. 5 is a cross-sectional view illustrating an embodiment of a lighting device.

FIG. 5 is a cross-sectional view illustrating another structural example of the lighting device. As illustrated in FIG. 5, a lighting device 13 corresponds to the one in which the substrate 231 of the lighting device 12 is provided on the substrate 132 side (the front side of the organic EL light-emitting device 100). A plan layout of each of the lighting devices 12 and 13 is the same as that of the lighting device 10.

Similarly to the lighting device 10, the lighting devices 12 and 13 each has a structure in which the organic EL element 101 is sealed in space where the organic EL element 101 is cut off from outside air and the LED light 250 does not pass through the organic EL element 101, so that both prevention of deterioration of the LED light 250 and a reduction in the loss of the LED light 250 can be achieved. The OLED light 150 passes through the substrate 231 in the lighting device 13; thus, the loss of the OLED light 150 in the lighting device 12 is smaller than that in the lighting device 13.

The LED 200 can be provided apart from the organic EL element 101; thus, deterioration of the organic EL element 101 due to heat generation from the LED 200 can be suppressed. In the lighting device 12, the substrate 231 is provided on the substrate 131 side; thus, provision of a cooling wheel for the LED 200 is easier than that in the lighting device 13.

By such an effect, luminous efficiency and luminance of the lighting devices 12 and 13 can be improved, and the life of the lighting devices 12 and 13 can be extended.

In the lighting devices 10 to 13, a glass substrate, a quartz substrate, a plastic substrate, or the like can be used for the substrates 131 and 132. As a material for the plastic substrate, fiberglass-reinforced plastics (FRP), polyvinyl fluoride (PVF), polyester, acrylic, or the like can be used. Alternatively, a flexible substrate such as an organic resin film and a metal film can be used for the substrates 131 and 132. Examples of a resin for the organic resin film include an aramid resin, a polyethylene naphthalate (PEN) resin, a polyether sulfone (PES) resin, a polyphenylene sulfide (PPS) resin, a polyimide (PI) resin, and the like. A substrate which transmits the OLED light 150 is selected for the substrate through which the OLED light 150 passes. The substrate 132 can be any substrate that can seal the organic EL element 101 in the lighting devices 10 and 11, and a substrate, a sealant can, or the like, formed of a metal material such as stainless steel or aluminum, can also be used.

In the lighting devices 10 to 13, a mixture of the OLED light 150 and the LED light 250 is used as illumination light. For example, an LED which emits blue light (a peak of the emission wavelength is greater than or equal to 400 nm and less than or equal to 500 nm) is preferably used as the LED 200 in terms of energy conversion efficiency so as to obtain white illumination light. As an LED which emits blue light, an LED in which a gallium nitride compound semiconductor is used in an emission region is given. On the other hand, an element which emits yellow to orange light (a wavelength is greater than or equal to 560 nm and less than or equal to 580 nm) that is a complementary color of blue is preferably used as the organic EL element 101. The organic EL element 101 which has a broad emission spectrum in the wavelength range of greater than or equal to 560 nm and less than or equal to 580 nm, high luminance, a long life, and high energy conversion efficiency can be achieved. Further, the wavelength of greater than or equal to 560 nm and less than or equal to 580 nm is a wavelength having high luminosity. Therefore, by the combination of the LED 200 which emits blue light and the organic EL element 101 which emits yellow light, a white lighting device which has high luminance and high luminous efficiency can be easily achieved.

The color (wavelength) of the OLED light 150 can be determined by a light-emitting material used for the light-emitting layer 113. Examples of a yellow light-emitting material include bis(2,4-diphenyl-1,3-oxazolato-N,C$^{2'}$) iridium(III)acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), and bis (2-phenylbenzothiazolato-N,C$^{2'}$)iridium(III)acetylacetonate (abbreviation: Ir(bt)$_2$(acac)). Examples of an orange light-emitting material include tris(2-phenylquinolinato-N,C$^{2'}$) iridium(III) (abbreviation: Ir(pq)$_3$), and bis(2-phenylquinolinato-N,C$^{2'}$)iridium(III) acetylacetonate (abbreviation: Ir(pq)$_2$(acac)). Such light-emitting materials are phosphorescent compounds.

All the organic EL elements 101 included in the lighting devices 10 to 13 do not necessarily have the same emission color, and the organic EL elements 101 having different emission colors may be provided in each of the lighting devices 10 to 13. This is the same in the LED 200. By providing the organic EL elements 101 and/or LEDs 200 each having different emission colors, illumination light of the lighting devices 10 to 13 can have a desired color.

Figure 6:
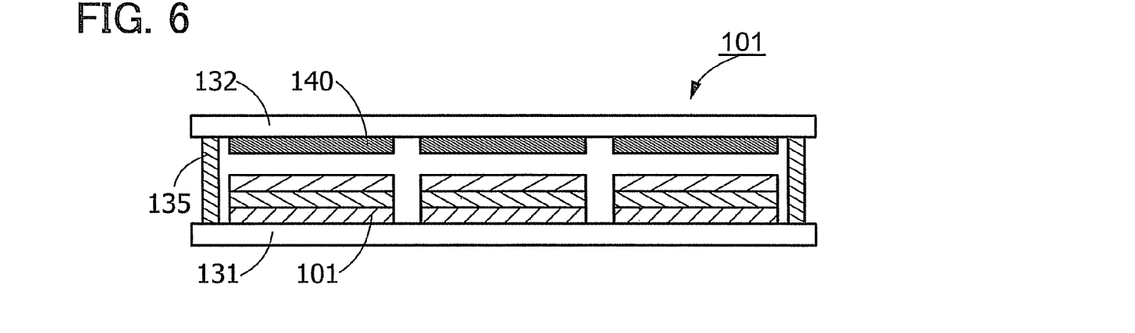
FIG. 6 is a cross-sectional view illustrating an embodiment of an organic EL light-emitting device.

Further, the organic EL light-emitting device 100 may be provided with a plurality of organic EL elements 101 over the substrate 131. An example of such a structure is illustrated in FIG. 6. As illustrated in FIG. 6, the plurality of organic EL elements 101 are provided in space sealed by the substrates 131 and 132, and the sealant 135. In that case, the emission colors of the organic EL elements 101 may be the same or different.

Embodiment 1 can be implemented in appropriate combination with the structures described in the other embodiments.

(Embodiment 2)

In this embodiment, description is made on an organic EL element used in a lighting device.

Figure 7A:
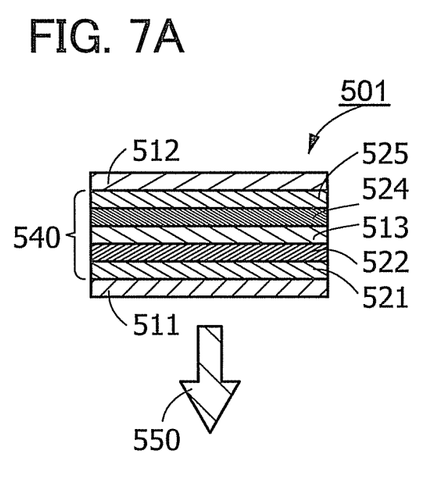
FIGS. 7A to 7C are cross-sectional views each illustrating an embodiment of an organic EL element.

FIG. 7A illustrates an example of a stacked structure of an organic EL element. An organic EL element 501 includes at least an electrode 511, an electrode 512, and a light-emitting layer 513. One of the electrodes 511 and 512 is an anode, and the other is a cathode. Here, the electrodes 511 and 512 are defined as an anode and a cathode, respectively, and a stacked structure of the organic EL element 501 is described. OLED light 550 emitted from the light-emitting layer 513 is extracted from the electrode 511.

In the organic EL element 501, a hole-injection layer 521, a hole-transport layer 522, a light-emitting layer 513, an electron-transport layer 524, and an electron-injection layer 525 are provided between the electrodes 511 and 512. The electrodes 511 and 512, and each layer (513, 521, 522, 524, and 525) may have a single layer structure or a stacked structure, and can be formed by a known manufacturing method (a sputtering method, an evaporation method including a vacuum evaporation method, an inkjet method, a coating method, or the like). Here, the layer formed between the electrodes 511 and 512 is referred, to as an OLED layer 540.

The electrode 511 is formed of a conductive film which transmits the OLED light 550. As a material for the conductive film, indium oxide, indium tin oxide (also referred to as ITO), indium zinc oxide, zinc oxide, zinc oxide to which gallium is added, graphene, or the like can be used. Alternatively, the conductive film can be formed using a metal material such as gold, platinum, nickel, tungsten, chromium, molybdenum, iron, cobalt, copper, palladium, and titanium, or a nitride of any of these metal materials (e.g., titanium nitride). In that case, the conductive film is formed to be thin enough to transmit the OLED light 550.

The electrode 512 is formed of a conductive film which reflects the OLED light 550. As a material for the conductive film, for example, a metal such as aluminum, gold, platinum, silver, nickel, tungsten, chromium, molybdenum, iron, cobalt, copper, or palladium, or an alloy of any of these materials can be used. As the alloy, the following can be given for example: an aluminum alloy such as an alloy of aluminum and titanium, an alloy of aluminum and nickel, and an alloy of aluminum and neodymium; and an alloy of silver and copper. In the case where an aluminum alloy film is used, an aluminum alloy and either a metal film (e.g., a titanium film) or a metal oxide film (e.g., a titanium oxide film) may be stacked. With such a stacked structure, oxidation of the aluminum alloy film can be prevented.

The light-emitting layer 513 is a layer containing a light-emitting organic compound. As the light-emitting organic compound, for example, a fluorescent compound which exhibits fluorescence or a phosphorescent compound which exhibits phosphorescence can be used. The organic EL element 501 may include two or more light-emitting layers 513. In this case, by making the emission colors of the light-emitting layers different, the OLED light 550 with a desired color can be obtained.

As the fluorescent compound that can be used for the light-emitting layer 513, a green light-emitting material, a yellow light-emitting material, or a red light-emitting material is given. As examples of the green light-emitting material, the following are given: N-(9,10-diphenyl-2-anthryl)-N,9-diphenyl-9H-carbazol-3-amine (abbreviation: 2PCAPA), N-[9,10-bis(1,1'-biphenyl-2-yl)-2-anthryl]-N,9-diphenyl-9H-carbazol-3-amine (abbreviation: 2PCABPhA), N-(9,10-diphenyl-2-anthryl)-N,N',N'-triphenyl-1,4-phenylenediamine (abbreviation: 2DPAPA), N-[9,10-bis(1,1'-biphenyl-2-yl)-2-anthryl]-N,N',N'-triphenyl-1,4-phenylenediamine (abbreviation: 2DPABPhA), N-[9,10-bis(1,1'-biphenyl-2-yl)]-N-[4-(9H-carbazol-9-yl)phenyl]-N-phenylanthracen-2-amine (abbreviation: 2YGABPhA), and N,N,9-triphenylanthracen-9-amine (abbreviation: DPhAPhA). As an example of the yellow light-emitting material, rubrene, 5,12-bis(1,1'-biphenyl-4-yl)-6,11-diphenyltetracene (abbreviation: BPT) can be given. As examples of the red light-emitting material, N,N,N',N'-tetrakis(4-methylphenyl)tetracene-5,11-diamine (abbreviation: p-mPhTD), and 7,14-diphenyl-N,N,N',N'-tetrakis(4-methylphenyl)acenaphtho [1,2-a]fluoranthene-3,10-diamine (abbreviation: p-mPhAFD) can be given.

As the phosphorescent compound that can be used for the light-emitting layer 513, a green light-emitting material, a yellow light-emitting material, an orange light-emitting material, or a red light-emitting material is given. As examples of the green light-emitting material, the following are given: tris(2-phenylpyridinato-N,C$^{2'}$)iridium(III) (abbreviation: Ir(ppy)$_3$), bis(2-phenylpyridinato-N,C$^{2'}$)iridium(III) acetylacetonate (abbreviation: Ir(ppy)$_2$(acac)), bis(1,2-diphenyl-1H-benzimidazolato)iridium(III) acetylacetonate (abbreviation: Ir(pbi)$_2$(acac)), bis(benzo[h]quinolinato)iridium(III) acetylacetonate (abbreviation: Ir(bzq)$_2$(acac)), and tris(benzo[h]quinolinato)iridium(III) (abbreviation: Ir(bzq)$_3$).

As examples of the yellow light-emitting material, the following are given: bis(2,4-diphenyl-1,3-oxazolato-N,C$^{2'}$) iridium(III) acetylacetonate (abbreviation: Ir(dpo)$_2$(acac)), bis[2-(4'-perfluorophenylphenyl)pyridinato]iridium(III) acetylacetonate (abbreviation: Ir(p-PF-ph)$_2$(acac)), bis(2-phenylbenzothiazolato-N,C$^{2'}$)iridium(III) acetylacetonate (abbreviation: Ir(bt)$_2$(acac)), (acetylacetonato)bis[2,3-bis(4-fluorophenyl)-5-methylpyrazinato]iridium(III) (abbreviation: Ir(Fdppr-Me)$_2$(acac)), and (acetylacetonato)bis{2-(4-methoxyphenyl)-3,5-dimethylpyrazinato}iridium(III) (abbreviation: Ir(dmmoppr)$_2$(acac)).

As examples the orange light-emitting material, the following are given: tris(2-phenylquinolinato-N,C$^{2'}$)iridium(III) (abbreviation: Ir(pq)$_3$), bis(2-phenylquinolinato-N,C$^{2'}$) iridium(III) acetylacetonate (abbreviation: Ir(pq)$_2$(acac)), (acetylacetonato)bis(3,5-dimethyl-2-phenylpyrazinato) iridium(III) (abbreviation: Ir(mppr-Me)$_2$(acac)), and (acetylacetonato)bis(5-isopropyl-3-methyl-2-phenylpyrazinato) iridium(III) (abbreviation: Ir(mppr-iPr)$_2$(acac)).

As examples of the red light-emitting material, the following are given: organometallic complexes such as bis[2-(2'-benzo[4,5-a]thienyl)pyridinato-N,C$^{3'}$)iridium(III)acetylacetonate (abbreviation: Ir(btp)$_2$(acac)), bis(1-phenylisoquinolinato-N,C$^{2'}$)iridium(III) acetylacetonate (abbreviation: Ir(piq)$_2$(acac)), (acetylacetonato)bis[2,3-bis (4-fluorophenyl)quinoxalinato]iridium(III) (abbreviation: Ir(Fdpq)$_2$(acac)), (acetylacetonato)bis(2,3,5-triphenylpyrazinato)iridium(III) (abbreviation: Ir(tppr)$_2$(acac)), (dipivaloylmethanato)bis(2,3,5-triphenylpyrazinato)iridium (III) (abbreviation: Ir(tppr)$_2$(dpm)), and 2,3,7,8,12,13,17,18-octaethyl-21H,23H-porphyrin)platinum(II) (abbreviation: PtOEP). In addition, rare-earth metal complexes, such as tris(acetylacetonato) (monophenanthroline)terbium(III) (abbreviation: Tb(acac)$_3$(Phen)), tris(1,3-diphenyl-1,3-propanedionato) (monophenanthroline)europium(III) (abbreviation: Eu(DBM)$_3$(Phen)), and tris[1-(2-thenoyl)-3,3,3-trifluoroacetonato](monophenanthroline)europium(III) (abbreviation: Eu(TTA)$_3$(Phen)), exhibit light emission from rare-earth metal ions (electron transition between different multiplicities), and thus can be used as phosphorescent compounds.

The light-emitting layer 513 can be formed using a film in which the above-described light-emitting material (a guest material) is dispersed in another substance (a host material). As the host material, it is preferable to use a substance which has a higher lowest unoccupied molecular orbital level (LUMO level) than the light-emitting material and has a lower highest occupied molecular orbital level (HOMO level) than the light-emitting material. Examples of the host material include a heterocyclic compound, a condensed aromatic compound, and an aromatic amine compound. The light-emitting layer 513 is formed of a film in which a light-emitting material is dispersed in a host material, whereby the crystallization of the light-emitting layer 513 can be prevented and concentration quenching by the guest material can be prevented. Further, as the light-emitting material, plural kinds of host materials can be used.

Examples of the heterocyclic compound that is used as the host material include a metal complex such as Alq, tris(4-methyl-8-quinolinolato)aluminum(III) (abbreviation: Almq$_3$), bis(10-hydroxybenzo[h] quinolinato)beryllium(II) (abbreviation: BeBq$_2$), bis(2-methyl-8-quinolinolato)(4-phenylphenolato)aluminum(III) (abbreviation: BAlq), bis (8-quinolinolato)zinc(II) (abbreviation: Znq), bis[2-(2-benzoxazolyl)phenolato]zinc(II) (abbreviation: ZnPBO), or bis[2-(2-benzothiazolyl)phenolato]zinc(II) (abbreviation: ZnBTZ); 2-(4-biphenylyl)-5-(4-tert-butylphenyl)-1,3,4-oxadiazole (abbreviation: PBD); 1,3-bis[5-(p-tert-butylphenyl)-1,3,4-oxadiazol-2-yl]benzene (abbreviation: OXD-7); 3-(4-biphenylyl)-4-phenyl-5-(4-tert-butylphenyl)-1,2,4-triazole (abbreviation: TAZ); 2,2',2"-(1,3,5-benzenetriyl)tris(1-phenyl-1H-benzimidazole) (abbreviation: TPBI); bathophenanthroline (abbreviation: BPhen); and bathocuproine (abbreviation: BCP).

Examples of the condensed aromatic compound that is used as the host material include 9-[4-(10-phenyl-9-anthryl)phenyl]-9H-carbazole (abbreviation: CzPA); 3,6-diphenyl-9-[4-(10-phenyl-9-anthryl)phenyl]-9H-carbazole (abbreviation: DPCzPA); 9,10-bis(3,5-diphenylphenyl)anthracene (abbreviation: DPPA); 9,10-di(2-naphthyl)anthracene (abbreviation: DNA); 2-tert-butyl-9,10-di(2-naphthyl)anthracene (abbreviation: t-BuDNA); 9,9'-bianthryl (abbreviation: BANT); 9,9'-(stilbene-3,3'-diyl)diphenanthrene (abbreviation: DPNS); 9,9'-(stilbene-4,4'-diyl)diphenanthrene (abbreviation: DPNS2); 3,3',3"-(benzene-1,3,5-triyl)tripyrene (abbreviation: TPB3); 9,10-diphenylanthracene (abbreviation: DPAnth); and 6,12-dimethoxy-5,11-diphenylchrysene.

Examples of the aromatic amine compound that is used as the host material include N,N-diphenyl-9-[4-(10-phenyl-9-anthryl)phenyl]-9H-carbazol-3-amine (abbreviated to CzA1PA), 4-(10-phenyl-9-anthryl)triphenylamine (abbreviation: DPhPA), N,9-diphenyl-N-[4-(10-phenyl-9-anthryl)phenyl]-9H-carbazol-3-amine (abbreviation: PCAPA), N,9-diphenyl-N-{4-[4-(10-phenyl-9-anthryl)phenyl]phenyl}9H-carbazol-3-amine (abbreviation: PCAPBA), N-(9,10-diphenyl-2-anthryl)-N,9-diphenyl-9H-carbazol-3-amine (abbreviation: 2PCAPA), NPB (or α-NPD), TPD, DFLD-PBi, and BSPB.

A high molecular compound can be used as the light-emitting material of the light-emitting layer 513. As examples of a green light-emitting material, the following are given: poly(p-phenylenevinylene) (abbreviation: PPV), poly[(9,9-dihexylfluorene-2,7-diyl)-alt-co-(benzo[2,1,3]thiadiazole-4,7-diyl)] (abbreviation: PFBT), and poly[(9,9-dioctyl-2,7-divinylenfluorenylene)-alt-co-(2-methoxy-5-(2-ethylhexyloxy)-1,4-phenylene)]. As examples of an orange to red light-emitting material, the following are given: poly[2-methoxy-5-(2'-ethylhexoxy)-1,4-phenylenevinylene] (abbreviation: MEH-PPV), poly(3-butylthiophene-2,5-diyl) (abbreviation: R4-PAT), poly{[9,9-dihexyl-2,7-bis(1-cyanovinylene)fluorenylene]-alt-co-[2,5-bis(N,N'-diphenylamino)-1,4-phenylene]}, and poly{[2-methoxy-5-(2-ethylhexyloxy)-1,4-bis(1-cyanovinylenephenylene)]-alt-co-[2,5-bis(N,N-diphenylamino)-1,4-phenylene]} (abbreviation: CN-PPV-DPD).

The hole-injection layer 521 is a layer including a substance having a high hole-injection property (hereinafter referred to as a hole-injection material). As the hole-injection material, a metal oxide, a phthalocyanine-based compound, an aromatic amine compound, a high molecular compound (e.g., an oligomer, a dendrimer, and a polymer), or the like can be used Examples of the metal oxide used as the hole-injection material include molybdenum oxide, titanium oxide, vanadium oxide, rhenium oxide, ruthenium oxide, chromium oxide, zirconium oxide, hafnium oxide, tantalum oxide, silver oxide, tungsten oxide, manganese oxide, and the like.

Examples of the phthalocyanine compound used as the hole-injection material include phthalocyanine (abbreviation: H$_2$Pc), and copper(II)phthalocyanine (abbreviation: CuPc).

Examples of the aromatic amine compound used as the hole-injection material include 4,4',4"-tris(N,N-diphenylamino)triphenylamine (abbreviation: TDATA), 4,4',4"-tris[N-(3-methylphenyl)-N-phenylamino]triphenylamine (abbreviation: MTDATA), 4,4'-bis[N-(4-diphenylaminophenyl)-N-phenylamino]biphenyl (abbreviation: DPAB), 4,4'-bis(N-{4-[N'-(3-methylphenyl)-N-phenylamino]phenyl}-N-phenylamino)biphenyl (abbreviation: DNTPD), 1,3,5-tris[N-(4-diphenylaminophenyl)-N-phenylamino]benzene (abbreviation: DPA3B), 3-[N-(9-phenylcarbazole-3-yl)-N-phenylamino]-9-phenylcarbazole (abbreviation: PCzPCA1), 3,6-bis[N-(9-phenylcarbazole-3-yl)-N-phenylamino]-9-phenylcarbazole (abbreviation: PCzPCA2), and 3-[N-(1-naphthyl)-N-(9-phenylcarbazol-3-yl)amino]-9-phenylcarbazole (abbreviation: PCzPCN1).

Examples of the high molecular compound used as the hole-injection material include poly(N-vinylcarbazole) (abbreviation: PVK), poly(4-vinyltriphenylamine) (abbreviation: PVTPA), poly[N-(4-{N'-[4-(4-diphenylamino)phenyl]phenyl-N'-phenylamino}phenyl)methacrylamide] (abbreviation: PTPDMA), and poly[N,N'-bis(4-butylphenyl)-N,N'-bis(phenyl)benzidine] (abbreviation: Poly-TPD). In addition, a high molecular compound to which acid is added, such as poly(3,4-ethylenedioxythiophene)/poly(styrenesulfonic acid) (PEDOT/PSS) or polyaniline/poly(styrenesulfonic acid) (PAni/PSS), may be used.

The hole-injection layer 521 can be formed using a film formed of a composite material in which an acceptor substance is contained in a substance having a high hole-transport property (hereinafter referred to as a hole-transport material). As the hole-transport material, any of various organic compounds such as an aromatic amine compound, a carbazole derivative, an aromatic hydrocarbon, and a high molecular compound (such as an oligomer, a dendrimer, or a polymer) can be used. The hole-injection layer 521 formed of such a composite material can be formed by co-depositing the hole-transport material and the acceptor substance. The hole-transport material needs to have a hole-transport property higher than an electron-transport property, and preferably has a hole mobility of $10^{-6}$ cm$^2$/Vs or higher. The hole-transport material having a hole mobility of $1\times10^{-6}$ cm$^2$/Vs or higher is described below.

Examples of the hole-transport material include aromatic amine compounds such as TDATA, MTDATA, DPAB, DNTPD, DPA3B, PCzPCA1, PCzPCA2, PCzPCN1, NPB (α-NPD), N,N'-bis(3-methylphenyl)-N,N'-diphenyl-[1,1'-biphenyl]-4,4'-diamine (abbreviation: TPD), and 4-phenyl-4'-(9-phenylfluoren-9-yl)triphenylamine (abbreviation: BPAFLP). In addition, examples of the hole-transport material include carbazole derivatives such as 4,4'-di(N-carbazolyl)biphenyl (abbreviation: CBP); 1,3,5-tris[4-(N-carbazolyl)phenyl]benzene (abbreviation: TCPB); 9-[4-(10-phenyl-9-anthryl)phenyl]-9H-carbazole (abbreviation: CzPA); 9-phenyl-3-[4-(10-phenyl-9-anthryl)phenyl]-9H-carbazol (abbreviation: PCzPA), and 1,4-bis[4-(N-carbazolyl)phenyl]-2,3,5,6-tetraphenylbenzene.

Examples of the hole-transport material include aromatic hydrocarbon compounds such as 2-tert-butyl-9,10-di(2-naphthyl)anthracene (abbreviation: t-BuDNA), 2-tert-butyl-9,10-di(1-naphthyl)anthracene, 9,10-bis(3,5-diphenylphenyl)anthracene (abbreviation: DPPA), 2-tert-butyl-9,10-bis(4-phenylphenyl)anthracene (abbreviation: t-BuDBA), 9,10-di(2-naphthyl)anthracene (abbreviation: DNA), 9,10-diphenylanthracene (abbreviation: DPAnth), 2-tert-butylanthracene (abbreviation: t-BuAnth), 9,10-bis(4-methyl-1-naphthyl)anthracene (abbreviation: DMNA), 9,10-bis[2-(1-naphthyl)phenyl]-2-tert-butyl-anthracene, 9,10-bis[2-(1- naphthyl)phenyl]anthracene, 2,3,6,7-tetramethyl-9,10-di(1-naphthyl)anthracene, 2,3,6,7-tetramethyl-9,10-di(2-naphthyl)anthracene, 9,9'-bianthryl, 10,10'-diphenyl-9,9'-bianthryl, 10,10'-bis(2-phenylphenyl)-9,9'-bianthryl, 10,10'-bis[(2,3,4,5,6-pentaphenyl)phenyl]-9,9'-bianthryl, anthracen, tetracene, rubrene, perylene, 2,5,8,11-tetra(tert-butyl)perylene, pentacene, coronene, 4,4'-bis(2,2-diphenyl-vinyl)biphenyl (abbreviation: DPVBi), and 9,10-bis[4-(2,2-diphenylvinyl)phenyl]anthracene (abbreviation: DPVPA).

As the acceptor substance, an organic compound such as 7,7,8,8-tetracyano-2,3,5,6-tetrafluoroquinodimethane (abbreviation: $F_4$-TCNQ) or chloranil, or an oxide of a transition metal can be used. Specifically, an oxide of a transition metal belonging to any one of Groups 4 to 8 (e.g., vanadium oxide, niobium oxide, tantalum oxide, chromium oxide, molybdenum oxide, tungsten oxide, manganese oxide, and rhenium oxide) is preferably used because its acceptor property is high.

Further, the hole-injection layer 521 can be formed of a composite material of the above-described high molecular compound, such as PVK, PVTPA, PTPDMA, or Poly-TPD, and the above-described acceptor substance.

The hole-transport layer 522 is a layer containing a hole-transport material. As the hole-transport material used for the hole-transport layer 522, the following aromatic amine compounds can be given for example: NPB, TPD, BPAFLP, 4,4'-bis[N-(9,9-dimethylfluoren-2-yl)-N-phenylamino]biphenyl (abbreviation: DFLDPBi), and 4,4'-bis[N-(spiro-9,9'-bifluoren-2-yl)-N-phenylamino]biphenyl (abbreviation: BSPB). Further, as the hole-transport material, a carbazole derivative such as CBP, CzPA, or PCzPA; an anthracene derivative such as t-BuDNA, DNA, or DPAnth; or a high molecular compound such as PVK, PVTPA, PTPDMA, or Poly-TPD can also be used.

The electron-transport layer 524 is a layer containing a substance having a high electron-transport property (hereinafter referred to as an electron-transport material). A substance having an electron mobility of greater than or equal to $1\times10^{-6}$ cm$^2$/Vs is preferably used as the electron-transport material. Examples of the electron-transport material are a metal complex having a quinoline skeleton or a benzoquinoline skeleton, such as tris(8-quinolinolato)aluminum (Alq), tris(4-methyl-8-quinolinolato)aluminum (Almq$_3$), bis(10-hydroxybenzo[h]-quinolinato)beryllium (BeBq$_2$), and bis(2-methyl-8-quinolinolato)(4-phenylphenolato)aluminum (BAlq). In addition, a metal complex having an oxazole-based or thiazole-based ligand, such as bis[2-(2-hydroxyphenyl)-benzoxazolato]zinc (abbreviation: Zn(BOX)$_2$) or bis[2-(2-hydroxyphenyl)-benzothiazolato]zinc (abbreviation: Zn(BTZ)$_2$) can be used. In addition to the metal complex, 2-(4-biphenylyl)-5-(4-tert-butylphenyl)-1,3,4-oxadiazole (abbreviation: PBD), 1,3-bis[5-(p-tert-butylphenyl)-1,3,4-oxadiazol-2-yl]benzene (abbreviation: OXD-7), 3-(4-biphenylyl)-)-4-phenyl-5-(4-tert-butylphenyl)-1,2,4-triazole (abbreviation: TAZ), bathophenanthroline (abbreviation: BPhen), bathocuproine (abbreviation: BCP), or the like can be used.

The electron-injection layer 525 is a layer containing a substance having a high electron-injection property (hereinafter referred to as an electron-injection material). As the electron-injection material, an alkali metal, an alkaline earth metal, an alkali metal compound, or an alkaline earth metal compound, such as lithium, cesium, calcium, lithium fluoride, cesium fluoride, calcium fluoride, or lithium oxide; or a rare earth metal compound such as erbium fluoride can be used. Further, the electron-injection layer 525 can be formed using the material for the electron-transport layer 524.

Figure 7B:
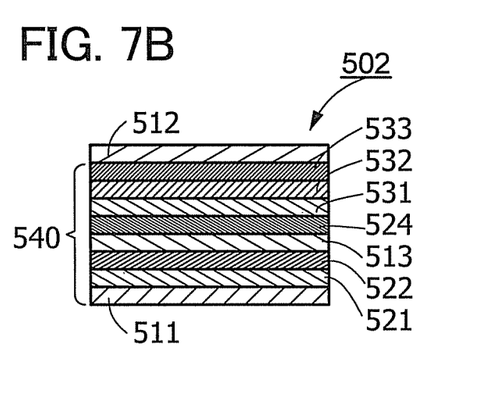

Instead of the electron-injection layer 525, an electron-injection buffer layer and an electron-relay layer may be provided for the OLED layer 540. FIG. 7B illustrates an example of a stacked structure of an organic EL element including the electron-injection buffer layer and the electron-relay layer. As illustrated in FIG. 7B, the organic EL element 502 includes the electron-injection buffer layer 531 and the electron-relay layer 532 between the electron-transport layer 524 and the electrode 512. Further, a composite material layer 533 is formed so as to be in contact with the electrode 512. Each layer (531, 532, and 533) is formed so as to facilitate the movement of electrons between the electrode 512 and the electron-transport layer 524 and to reduce drive voltage of the organic EL element 502.

By providing the composite material layer 533 in contact with the electrode 512, damage to the OLED layer 540 in forming the electrode 512 can be reduced. The composite material layer 533 is extremely effective in reducing damage in the case of forming the electrode 512 by a sputtering method. The composite material layer 533 can be formed using a composite material in which an acceptor substance is included in the above-described hole-transport material used for the hole-transport layer 522.

The electron-injection buffer layer 531, which is provided so as to reduce an injection barrier between the composite material layer 533 and the electron-transport layer 524, can be formed using an electron-injection material. Examples of the electron-injection material include an alkali metal, an alkaline earth metal, a rare earth metal, an alkali metal compound (e.g., an oxide such as lithium oxide, a halide, and a carbonate such as lithium carbonate or cesium carbonate), an alkaline earth metal compound (e.g., an oxide, a halide, and a carbonate), a rare earth metal compound (e.g., an oxide, a halide, and a carbonate), and the like.

Further, the electron-injection buffer layer 531 can be formed using a composite material of an electron-transport material and a donor material. In that case, the donor material is preferably added so that the mass ratio thereof to the electron-transport material is greater than or equal to 0.001:1 and less than or equal to 0.1:1. Examples of the donor substance include an alkali metal, an alkaline-earth metal, a rare-earth metal, an alkali metal compound (including an oxide such as lithium oxide, a halide, and a carbonate such as lithium carbonate or cesium carbonate), an alkaline-earth metal compound (including an oxide, a halide, and a carbonate), and a rare-earth metal compound (including an oxide, a halide, and a carbonate), and an organic compound such as tetrathianaphthacene (abbreviation: TTN), nickelocene, and decamethylnickelocene. Further, the same material as the electron-transport material used for the electron-transport layer 524 is used for the electron-transport material of the electron-injection buffer layer 531.

The electron-relay layer 532 is preferably formed between the electron-injection buffer layer 531 and the composite material layer 533. As illustrated in FIG. 7B, by sandwiching the electron-relay layer 532 between the electron-injection buffer layer 531 and the composite material layer 533, the acceptor substance in the composite material layer 533 and the donor substance in the electron-injection buffer layer 531 are less likely to interact with each other, and thus their functions hardly interfere with each other The electron-relay layer 532 is a layer including an electron-transport material. For the electron-transport material, a material located between the LUMO level of the acceptor substance included in the composite material layer 533 and the LOMO level of the electron-transport material included in the electron-transport layer 524 is selected.

Examples of the electron-transport material include a phthalocyanine-based material, and a metal complex having a metal-oxygen bond and an aromatic ligand.

Examples of the phthalocyanine-based material include the followings: CuPc, phthalocyanine tin(II) complex (SnPc), phthalocyanine zinc complex (ZnPc), cobalt(II) phthalocyanine, β-form (CoPc), phthalocyanine iron (FePc), and vanadyl 2,9,16,23-tetraphenoxy-29H,31H-phthalocyanine (PhO-VOPc).

As the metal complex, a metal complex having a metal-oxygen double bond or a phthalocyanine-based material is preferable. Examples of the metal complex include PhO-VOPc, vanadyl phthalocyanine (VOPc), a phthalocyanine tin(IV) oxide complex (SnOPc), and a phthalocyanine titanium oxide complex (TiOPc).

A donor substance can be added to the electron-relay layer 532. The same material as the donor substance which can be added to the electron-injection buffer layer 531 can be used for this donor substance. In the case where the donor substance is contained in the electron-relay layer 532, in addition to the substances described above as the electron-transport material for the electron-relay layer 532, a substance having a LUMO level greater than the acceptor level of the acceptor substance in the composite material layer 533 can be used. Specifically, a substance having a LUMO level of greater than or equal to −5.0 eV, preferably, greater than or equal to −5.0 eV and less than or equal to −3.0 eV is preferably used as the electron-transport material. As examples of such a substance, a perylene derivative and a nitrogen-containing condensed aromatic compound can be given.

Examples of the perylene derivative include 3,4,9,10-perylenetetracarboxylic dianhydride (abbreviation: PTCDA), 3,4,9,10-perylenetetracarboxylic bisbenzimidazole (abbreviation: PTCBI), N,N'-dioctyl-3,4,9,10-perylenetetracarboxylic diimide (abbreviation: PTCDI-C8H), N,N'-dihexyl-3,4,9,10-perylenetetracarboxylic diimide (abbreviation: Hex PTC), and the like.

Examples of the nitrogen-containing condensed aromatic compound include pirazino[2,3-f][1,10]phenanthroline-2,3-dicarbonitrile (abbreviation: PPDN), 2,3,6,7,10,11-hexacyano-1,4,5,8,9,12-hexaazatriphenylene (abbreviation: HAT(CN)$_6$), 2,3-diphenylpyrido[2,3-b]pyrazine (abbreviation: 2PYPR), 2,3-bis(4-fluorophenyl)pyrido[2,3-b]pyrazine (abbreviation: F2PYPR), and the like.

In addition to these substances, examples of the electron-transport material include 7,7,8,8-tetracyanoquinodimethane (TCNQ), 1,4,5,8-naphthalenetetracarboxylic dianhydride (NTCDA), perfluoropentacene, copper hexadecafluorophthalocyanine (F$_{16}$CuPc); N,N'-bis(2,2,3,3,4,4,5,5,6,6,7,7,8,8-pentadecafluorooctyl)-1,4,5,8-naphthalenetetracarboxylic diimide (abbreviation: NTCDI-C8F), 3',4'-dibutyl-5,5''-bis(dicyanomethylene)-5,5''-dihydro-2,2': 5',2''-terthiophene) (DCMT), and methanofullerene (e.g., [6,6]-phenyl C$_{61}$ butyric acid methyl ester).

Figure 7C:
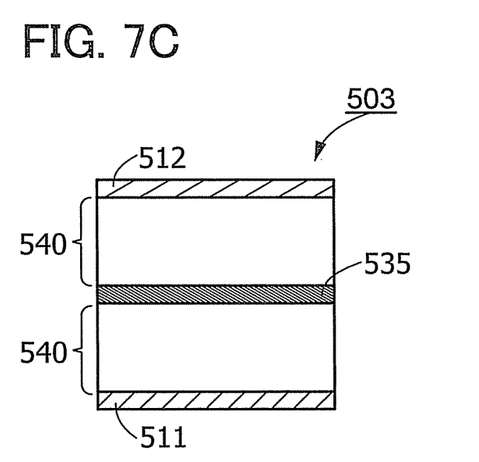

A plurality of OLED layers may be stacked for the organic EL element. FIG. 7C illustrates a structural example of an organic EL element including a plurality of OLED layers. As illustrated in FIG. 7C, an organic EL element 503 includes two OLED layers 540. In the case where two or more OLED layers 540 are stacked, a charge generation layer 535 is preferably provided between the two adjacent OLED layers 540. The charge generation layer 535 can be formed using the same composite material as the hole-injection layer 521. Further, the charge generation layer 525 can be formed of a stacked film of a layer containing the composite material and a layer containing another material. In that case, a layer except for the layer containing the composite material (the layer containing another material) can be formed using a composite material layer of a donor substance and an electron-transport material, a light-transmitting conductive film which can be used for the electrode 511 (e.g., a zinc oxide film or an ITO film), or the like. In either case, it is preferable that the charge generation layer 535 have a function to inject electrons into one of the OLED layers and inject holes into the other of the OLED layers. Note that by forming the charge generation layer 535 using plural kinds of layers, carrier balance of the organic EL element including the plurality of OLED layers 540 is improved, so that efficiency can be enhanced. Accordingly, the range of choices for the material of the OLED layer 540 is widened.

Embodiment 2 can be combined with any of other embodiments as appropriate.

(Embodiment 3)

In this embodiment, application examples of lighting devices are described with reference to FIG. 8, and FIGS. 9A to 9D.

Figure 8:
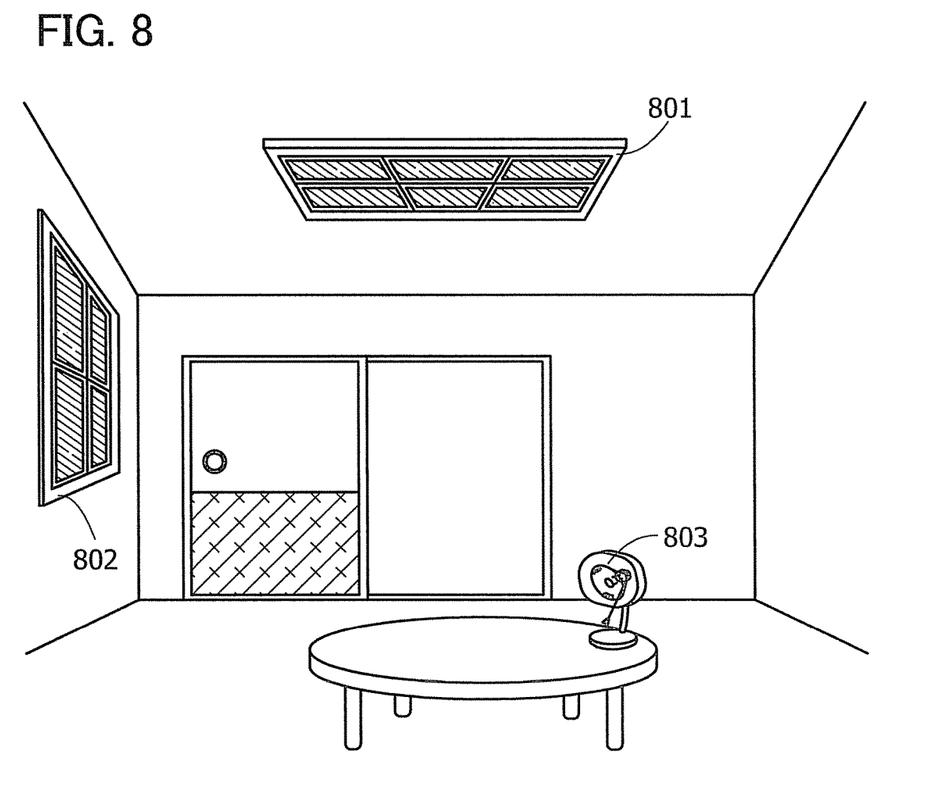
FIG. 8 illustrates application examples of lighting devices.
Figure 9A:
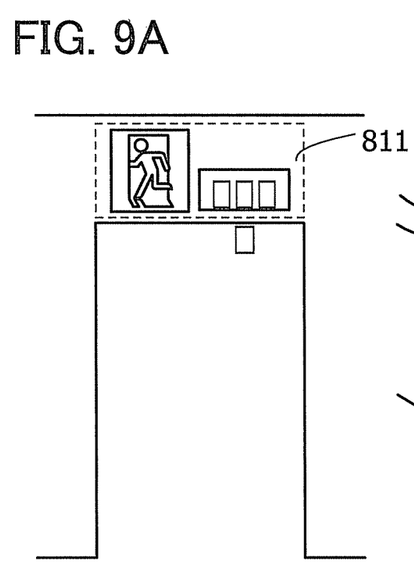
FIGS. 9A to 9D illustrate application examples of lighting devices.

FIG. 8 is a diagram illustrating indoor lighting devices each provided with the light-emitting device 10. The lighting device 10 can be used in a ceiling-mounted lighting device 801, a wall-mounted lighting device 802 and a table and desk lighting device 803, for example. The emission region of the lighting device 10 can be large and planar (a board shape); thus is quite preferable for the ceiling-mounted lighting device 801, the wall-mounted lighting device 802, the table and desk lighting device 803, and a floor lighting device. Note that FIG. 8 illustrates an example of residential lighting devices; however, the lighting device 10 can be used in indoor lighting devices in vehicles, trains, aircrafts, and the like Since the lighting device 10 is planar (a board shape), it is preferably used in light sources which illuminate a signboard, a sign, and the like from the back. As an example of such an embodiment, FIG. 9A shows an emergency exit light 811. A sign portion (a character, a pictogram, and the like) in the emergency exit light 811 is provided so as to transmit illumination light. The lighting device 10 can also be used as a backlight of a liquid crystal panel.

Figure 9B:
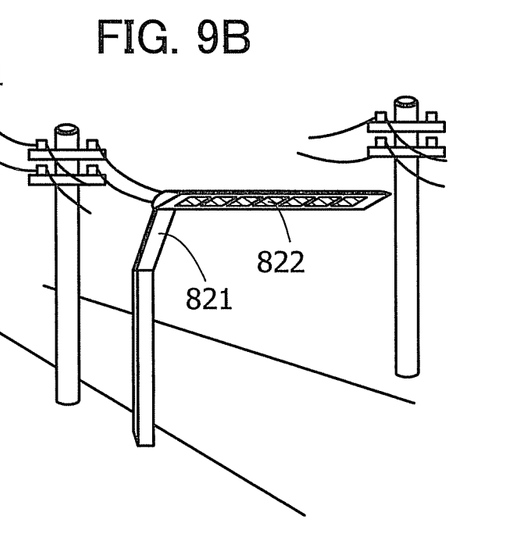

The lighting device 10 can be used in a light source of an outdoor lighting device. As an example of such an embodiment, FIG. 9B shows a street lamp 821. The lighting device 10 is used in a light source 822 of the street lamp 821.

Figure 9C:
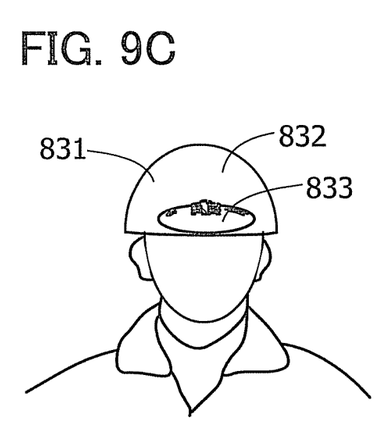

The lighting device 10 can be used as a light source of a small lighting device that is portable or wearable. As an example of such an embodiment, FIG. 9C illustrate a structure of a wearable light. As illustrated in FIG. 9C, a wearable light 831 includes a mounting portion 832 and a light source 833 fixed to the mounting portion 832. The lighting device 10 is used in the light source 833. The wearable light 831 in FIG. 9C is provided with a helmet-style mounting portion 832; however the structure of this embodiment is not limited thereto. The mounting portion 832 can be formed using a stretch belt.

Figure 9D:
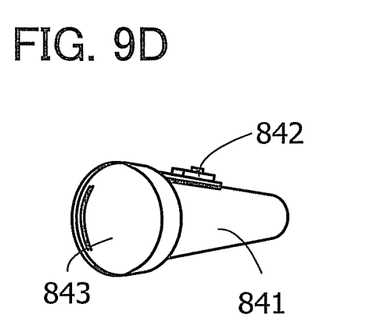

FIG. 9D illustrates a structural example of a handheld light. As illustrated in FIG. 9D, a handheld light includes a housing 841, a light source 843, and switches 842. The lighting device 10 is used in the light source 843. By the switches 842, the light source 843 is turned on and the brightness is controlled.

This application is based on Japanese Patent Application serial no. 2010-293039 filed with Japan Patent Office on Dec. 28, 2010, the entire contents of which are hereby incorporated by reference.

What is claimed is:

1. A device for lighting, the device comprising:
   a substrate comprising a first surface and a second surface opposed to the first surface;
   a first organic light-emitting device on the first surface;
   a second organic light-emitting device adjacent to the first organic light-emitting device and on the first surface; and
   an inorganic light-emitting diode on the second surface side of the substrate,
   wherein the first organic light-emitting device and the second organic light-emitting device are provided as surface light sources,
   wherein the inorganic light-emitting diode is provided as a point light source,
   wherein each of the first organic light-emitting device and the second organic light-emitting device includes a first substrate, a second substrate, a sealant, and an organic electroluminescence element,
   wherein each organic electroluminescence element is sealed in a volume defined by the corresponding first substrate, second substrate, and sealant,
   wherein the first organic light-emitting device and the second organic light-emitting device do not overlap with the inorganic light-emitting diode in a direction perpendicular to the first surface,
   wherein, when seen in a plan view, the inorganic light-emitting diode is entirely comprised in a gap separating the first organic light-emitting device and the second organic light-emitting device, and
   wherein, when seen in a plan view, the gap is free of any kind of light-emitting device comprising an organic electroluminescence element.

2. An indoor lighting device comprising the device according to claim 1.

3. The indoor lighting device according to claim 2, wherein the indoor lighting device is a ceiling-mounted lighting device, a wall-mounted lighting device, a table and desk lighting device, or a floor lighting device.

4. An outdoor lighting device comprising the device according to claim 1 as a light source.

5. A device for lighting, the device comprising:
   a substrate comprising a first surface and a second surface opposed to the first surface;
   a first organic light-emitting device on the first surface;
   a second organic light-emitting device adjacent to the first organic light-emitting device and on the first surface; and
   an inorganic light-emitting diode on the second surface side of the substrate,
   wherein the first organic light-emitting device and the second organic light-emitting device are provided as surface light sources,
   wherein the inorganic light-emitting diode is provided as a point light source,
   wherein each of the first organic light-emitting device and the second organic light-emitting device includes a first substrate, a second substrate, a sealant, and an organic electroluminescence element,
   wherein each organic electroluminescence element is sealed in a volume defined by the corresponding first substrate, second substrate, and sealant,
   wherein the first organic light-emitting device and the second organic light-emitting device do not overlap with the inorganic light-emitting diode in a direction perpendicular to the first surface,
   wherein, when seen in a plan view, the inorganic light-emitting diode is entirely comprised in a gap separating the first organic light-emitting device and the second organic light-emitting device,
   wherein, when seen in a plan view, the gap is free of any kind of light-emitting device comprising an organic electroluminescence element,
   wherein the inorganic light-emitting diode is configured to emit light comprising a peak emission wavelength of greater than or equal to 400 nm and less than or equal to 500 nm, and
   wherein an emission color of each of the organic electroluminescence elements is a complementary color of an emission color of the inorganic light-emitting diode.

6. An indoor lighting device comprising the device according to claim 5.

7. The indoor lighting device according to claim 6, wherein the indoor lighting device is a ceiling-mounted lighting device, a wall-mounted lighting device, a table and desk lighting device, or a floor lighting device.

8. An outdoor lighting device comprising the device according to claim 5 as a light source.

* * * * *